United States Patent
Takahashi

(10) Patent No.: US 9,246,476 B2
(45) Date of Patent: Jan. 26, 2016

(54) DRIVER CIRCUIT

(71) Applicant: SEMICONDUCTOR ENERGY LABORATORY CO., LTD., Atsugi-shi, Kanagawa-ken (JP)

(72) Inventor: Kei Takahashi, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/267,943

(22) Filed: May 2, 2014

(65) Prior Publication Data

US 2014/0333365 A1    Nov. 13, 2014

(30) Foreign Application Priority Data

May 10, 2013   (JP) ................................. 2013-099804

(51) Int. Cl.
   *H03L 5/00*     (2006.01)
   *H03K 3/356*    (2006.01)
   *H03K 19/0185*  (2006.01)

(52) U.S. Cl.
   CPC .. *H03K 3/356017* (2013.01); *H03K 19/018507* (2013.01); *H03K 19/018514* (2013.01); *H03K 19/018521* (2013.01)

(58) Field of Classification Search
   CPC ................ H03K 3/356017; H03K 19/018507; H03K 19/018514; H03K 19/018521; H03K 19/018528
   USPC ....................................... 327/333; 326/80, 81
   See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Kenneth B Wells
(74) *Attorney, Agent, or Firm* — Nixon Peabody LLP; Jeffrey L. Costellia

(57) ABSTRACT

An object is to prevent malfunction of a power device. In a semiconductor device for driving a power device for power supply, a buffer circuit and a level-shift circuit are configured by transistors having the same conductivity type. Furthermore, a capacitor is provided in the level-shift circuit, and a signal to be boosted is supplied to the capacitor and is boosted using capacitive coupling of the capacitor. Furthermore, a structure can be employed in which the signal is boosted in such a manner that, in the level-shift circuit, a capacitor is provided between a wiring for supplying a low power source potential and a wiring for supplying a potential to boost the signal so that a power transistor can be driven.

12 Claims, 11 Drawing Sheets

(56) References Cited

U.S. PATENT DOCUMENTS

| | | | |
|---|---|---|---|
| 7,049,850 B2 | 5/2006 | Shimizu | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,199,617 B1* | 4/2007 | Schrom et al. | 326/86 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,443,202 B2 | 10/2008 | Kimura et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,663,404 B2 | 2/2010 | Kimura et al. | |
| 7,674,650 B2 | 3/2010 | Akimoto et al. | |
| 7,732,819 B2 | 6/2010 | Akimoto et al. | |
| 7,961,006 B2 | 6/2011 | Kimura et al. | |
| 8,471,596 B2 | 6/2013 | Kimura et al. | |
| 8,854,104 B2* | 10/2014 | Chung et al. | 327/333 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101942 A1 | 5/2011 | Yamazaki et al. | |
| 2012/0294096 A1 | 11/2012 | Nishijima | |
| 2013/0163350 A1 | 6/2013 | Ohshima | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-328329 A | 11/2004 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomdra.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139; pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2006, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 in QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 . SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Using a Single-Output Gate-Driver for High-Side or Low-Side Drive, Texas Instruments Application Report, Jan. 15, 2013, Texas Instruments.

HV Floating MOS-Gate Driver ICs, International Rectifier Application Note AN-978, Mar. 23, 2007, International Rectifier.

\* cited by examiner

DRIVER CIRCUIT

BACKGROUND OF THE INVENTION

1. Field of the Invention

The present invention relates to a semiconductor device. In particular, the present invention relates to a semiconductor device functioning as a driver circuit for driving a power device for power supply.

2. Description of the Related Art

A power device is an element used to drive a load such as a motor. The power device can control supply of a large current to a load to perform the supply intermittently by a switching operation.

As an example of the power device, a power transistor such as an insulated gate bipolar transistor (IGBT) can be given. The power transistor has a large gate capacitance compared to other transistors.

Driving of the power transistor is controlled by pulse width modulation (PWM). PWM control is performed in accordance with a PWM signal output from a microcomputer or the like. The voltage of the PWM signal is too low to directly drive the power transistor having a large gate capacitance. Therefore, the PWM signal needs to be converted into a high-voltage signal and supplied to the power transistor.

A driver circuit for converting the PWM signal to a high-voltage signal includes a transistor including silicon. For example, Patent Document 1 discloses a structure of a semiconductor device in which an n-channel transistor and a p-channel transistor are provided over a silicon substrate and the on/off state of IGBT is controlled.

REFERENCE

Patent Document

[Patent Document 1] Japanese Published Patent Application No. 2004-328329

SUMMARY OF THE INVENTION

As described above, the semiconductor device disclosed in Patent Document 1 has the structure in which the n-channel transistor and the p-channel transistor, which are transistors including silicon, are used for the driver circuit for converting a PWM signal to a high-voltage signal.

In the case where the driver circuit is configured by complementary transistors, the number of photomasks to separately form an n-channel transistor and a p-channel transistor is increased. Therefore, the manufacturing cost is increased. In order to suppress such an increase in manufacturing cost, it is possible to configure the complementary transistors of the driver circuit by transistors having the same conductivity type.

In the case of configuring the driver circuit for converting a PWM signal into a high-voltage signal by the transistors having the same conductivity type, the dielectric breakdown of the transistors might occur because of a high voltage used to convert the signal. When the transistor is damaged, malfunction of the driver circuit including the transistor occurs.

Thus, according to one embodiment of the present invention, it is an object to prevent malfunction of a power device. Another object of one embodiment of the present invention is to reduce an increase in manufacturing cost.

Note that the description of a plurality of objects does not mutually preclude the existence. One embodiment of the present invention does not necessarily achieve all the objects. Objects other than those listed above are apparent from the description of the specification, drawings, and claims, and also such objects could be one embodiment of the present invention.

According to one embodiment of the present invention, in a semiconductor device which serves as a driver circuit for driving a power device for power supply, a buffer circuit and a level-shift circuit are configured by transistors having the same conductivity type. Furthermore, according to one embodiment of the present invention, a capacitor is provided in the level-shift circuit, and a signal to be boosted is supplied to the capacitor and is boosted using capacitive coupling of the capacitor.

In the structure of one embodiment of the present invention, transistors having the same conductivity type can be used as the transistors provided in the driver circuit for driving the power device for power supply. Furthermore, as the structure of one embodiment of the present invention, the following structure can be employed: the signal is boosted in such a manner that, in the level-shift circuit, a capacitor is provided between a wiring for supplying a low power source potential and a wiring for supplying a potential to boost the signal so that a power transistor can be driven.

One embodiment of the present invention is a semiconductor device including a first buffer circuit that converts a first signal into a second signal, a level-shift circuit that converts the second signal into a third signal, a second buffer circuit that converts the third signal into a fourth signal, and a third buffer circuit that outputs a first potential or a second potential in accordance with the fourth signal. Transistors of the level-shift circuit, the first buffer circuit, the second buffer circuit, and the third buffer circuit are transistors having the same conductivity type. The second signal is supplied to a capacitor of the level-shift circuit and converted into the third signal by capacitive coupling.

Another embodiment of the present invention is preferably the semiconductor device in which the first buffer circuit converts the first signal into the second signal having a potential higher than a potential of the first signal, and in which the second buffer circuit converts the third signal into the fourth signal having a potential higher than a potential of the third signal.

Another embodiment of the present invention is preferably the semiconductor device in which the level-shift circuit converts the second signal into the third signal having a potential higher than a potential of the second signal.

Another embodiment of the present invention is preferably the semiconductor device in which a semiconductor layer of the transistor includes an oxide semiconductor.

Another embodiment of the present invention is preferably the semiconductor device in which a wiring for supplying a low power source potential to the first buffer circuit is different from a wiring for supplying a low power source potential to the second buffer circuit and the third buffer circuit.

Another embodiment of the present invention is preferably the semiconductor device in which the level-shift circuit includes a first transistor, a second transistor, a first capacitor, and a second capacitor. A first terminal of the first transistor and a first terminal of the second transistor are electrically connected to a wiring for supplying the second potential. One of electrodes of the first capacitor is electrically connected to a second terminal of the first transistor and a gate of the second transistor, and the second buffer circuit. One of electrodes of the second capacitor is electrically connected to a second terminal of the second transistor, a gate of the first transistor, and the second buffer circuit. The second signal is supplied to the other electrode of the first capacitor, and an inverted signal of the second signal is supplied to the other electrode of the second capacitor.

One embodiment of the present invention includes a structure in which signals are supplied to the capacitors in the level-shift circuit by the capacitive coupling. With such a structure, a high voltage is not supplied directly between a source and a drain of the transistor in the level-shift circuit and thus dielectric breakdown of the transistor does not occur. Therefore, a driver circuit for driving a power device can be operated in a normal state and therefore its malfunction can be prevented. Furthermore, a shoot-through current can be prevented from flowing through the level-shift circuit, resulting in low power consumption.

Furthermore, according to the one embodiment of the present invention, the transistors of the buffer circuit and the level-shift circuit are transistors having the same conductivity type. With such a structure, a transistor provided in a driver circuit for driving a power device for power supply can be formed with a semiconductor material such as an oxide semiconductor, which is superior in terms of stability of electrical characteristics at a high temperature. Therefore, malfunction of the power device can be prevented. Moreover, an increase in manufacturing cost can be suppressed.

DETAILED DESCRIPTION OF THE INVENTION

Figure 1:
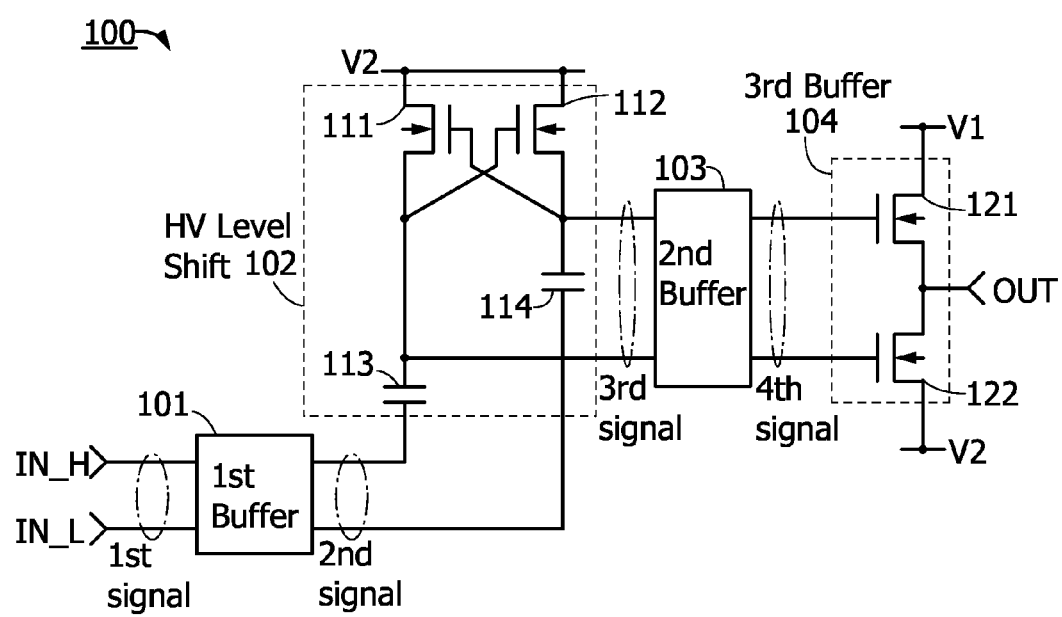
FIG. 1 is a block diagram showing a structure of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the reference drawings, the size, the thickness of layers, or regions may be exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on a structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

Note that in this specification, ordinal numbers such as "first", "second", and "third" are used in order to avoid confusion among components, and thus do not limit the number of the components.

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

In this specification, terms for describing arrangement, such as "over" and "under", are used for convenience for describing the positional relation between components with reference to drawings. Furthermore, the positional relation between components is changed as appropriate in accordance with a direction in which each component is described. Thus, the positional relation is not limited to that described with a term used in this specification and can be explained with another term as appropriate depending on the situation.

Note that the layout of circuit blocks in a drawing specifies the positional relationship for description. Thus, even when a drawing shows that different functions are achieved in different circuit blocks, an actual circuit or region may be configured so that the different functions are achieved in the same circuit or region. In addition, functions of circuit blocks in diagrams are specified for description, and even in the case where one circuit block is illustrated, blocks may be provided in an actual circuit or region so that processing performed by one circuit block is performed by a plurality of circuit blocks.

In this specification, voltage often refers to a potential difference between a given potential and a reference potential (e.g., a ground potential). Accordingly, the voltage, the potential, and the potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

In this specification, the term "parallel" indicates that the angle formed between two straight lines ranges from −10° to 10°, and accordingly also includes the case where the angle ranges from −5° to 5°. In addition, the term "perpendicular" indicates that the angle formed between two straight lines ranges from 80° to 100°, and accordingly includes the case where the angle ranges from 85° to 95°.

In this specification, trigonal and rhombohedral crystal systems are included in a hexagonal crystal system.

Embodiment 1

In this embodiment, a circuit configuration and operation of a semiconductor device according to one embodiment of the invention to be disclosed will be described with reference to FIG. 1.

Note that a semiconductor device means a circuit having a semiconductor element (e.g., a transistor or a diode) and a device having the circuit. The semiconductor device also means any device that can function by utilizing semiconductor characteristics. For example, an integrated circuit, a chip having an integrated circuit, a display device, a light-emitting device, a lighting device, and an electronic device are all semiconductor devices.

FIG. 1 is a block diagram of a semiconductor device. A semiconductor device 100 shown in FIG. 1 includes a buffer circuit 101 (also referred to as a first buffer circuit and expressed as 1st Buffer in the drawing), a level-shift circuit 102 (expressed as HV Level Shift in the drawing), a buffer circuit 103 (also referred to as a second buffer circuit and expressed as 2nd Buffer in the drawing), and a buffer circuit 104 (also referred to as a third buffer circuit and expressed as 3rd Buffer in the drawing).

In the semiconductor device 100 described in this embodiment, the buffer circuit 101, the buffer circuit 103, the buffer circuit 104, and the level-shift circuit 102 are configured by transistors having the same conductivity type. Therefore, the semiconductor device 100 can be configured by transistors having the same conductivity.

Furthermore, in the semiconductor device 100, a capacitor is provided in the level-shift circuit 102, and a signal to be boosted is supplied to the capacitor and is boosted using capacitive coupling of the capacitor. With such a structure, voltage applied between a source and a drain of a transistor in the level-shift circuit 102 can be made lower than voltage applied to the capacitor in the level-shift circuit 102, whereby dielectric breakdown of the transistor can be suppressed.

Next, circuits included in the semiconductor device 100 are described.

The buffer circuit 101 is a circuit having a function of boosting a PWM signal output from a microcomputer or the like to a signal that can operate the level-shift circuit 102 and/or converting the PWM signal into a signal with improved electric charge supply capability to be output. Signals input into the buffer circuit 101 are PWM signals output from the microcomputer or the like through a terminal IN_H and a terminal IN_L. Signals output from the buffer circuit 101 are signals input into the level-shift circuit 102.

In FIG. 1, the PWM signal output from the microcomputer or the like is referred to as a first signal (expressed as 1st signal in the drawing). Moreover, in FIG. 1, the signal output from the buffer circuit 101 and input into the level-shift circuit 102 is referred to as a second signal (expressed as 2nd signal in the drawing). Note that the PWM signals are signals for alternately turning on a transistor 121 and a transistor 122 of the buffer circuit 104 by being boosted by the buffer circuit 101, the level-shift circuit 102, and the buffer circuit 103.

Note that although the two signals input from the terminal IN_H and the terminal IN_L into the buffer circuit 101 are shown in FIG. 1 as examples of the PWM signal, one embodiment of the present invention is not limited thereto. For example, three or more PWM signals may be input into the buffer circuit 101. Note that the two signals input from the terminal IN_H and the terminal IN_L are preferably inverted signals of each other.

The level-shift circuit 102 includes a transistor 111, a transistor 112, a capacitor 113, and a capacitor 114. The transistors 111 and 112 are connected to a wiring supplied with a voltage V2 for driving a power transistor.

The level-shift circuit 102 is a circuit having a function of outputting the PWM signal output from the microcomputer or the like as a signal boosted to drive the power transistor on the basis of the second signal output from the buffer circuit 101. The signals input into the level-shift circuit 102 are output from the buffer circuit 101 and supplied to the capacitors 113 and 114. The signals output from the buffer circuit 101 are signals input into the level-shift circuit 102.

The second signal is supplied to the capacitors 113 and 114 of the level-shift circuit 102 by capacitive coupling. The second signal supplied to the level-shift circuit 102 by capacitive coupling is further boosted by the voltage V2 for driving the power transistor and output to the buffer circuit 103. In FIG. 1, the signal output from the level-shift circuit 102 and input into the buffer circuit 103 is referred to as a third signal (expressed as 3rd signal in the drawing). Note that the second signal and the third signal are originally the signals supplied to the terminals IN_H and IN_L, and two signals are supplied to two wirings in FIG. 1.

Each of the transistors 111 and 112 is a transistor functioning as a switch. Moreover, the transistors 111 and 112 are transistors having the same conductivity type. As an example, the transistors 111 and 112 are shown as n-channel transistors in FIG. 1.

As the operation of the transistors 111 and 112, the transistor whose gate is connected to the capacitor at an H level is turned on at the timing when one of the second signals input into the capacitors 113 and 114 is provided with an H level. On the other hand, the transistor whose gate is connected to the capacitor at an L level is turned off at the timing when the other of the second signals input into the capacitors 113 and 114 is at an L level. For example, when the second signal input into the capacitor 113 is provided at an H level, the transistor 112 is turned on, whereas when the second signal input into the capacitor 114 is at an L level, the transistor 111 is turned off. When the second signal input into the capacitor 113 is at an L level, the transistor 112 is turned off, whereas when the second signal input into the capacitor 114 is provided with an H level, the transistor 111 is turned on.

In a period during which the transistor 111 is on, current flows from the wiring supplied with the voltage V2 through a node at which the capacitor 113 connected to one of a source and a drain of the transistor 111 and the gate of the transistor 112 which is off are connected to each other; accordingly, the node is charged (first operation).

On the other hand, the transistor 112 operates in an opposite way to the transistor 111. In other word, in a period during which the transistor 112 is on, current flows from the wiring supplied with the voltage V2 through a node at which the capacitor 114 connected to one of a source and a drain of the transistor 112 and the gate of the transistor 111 which is off are connected to each other; accordingly, the node is charged (first operation).

In the period during which the transistor 111 is off, the node at which the capacitor 113 connected to one of the source and the drain of the transistor 111 and the gate of the transistor 112 are connected to each other is in an electrically floating state. At this time, the capacitor 113 is provided with an H level. Accordingly, the potential of the node in an electrically floating state is further raised by the capacitive coupling. A signal which is boosted by this capacitive coupling is output to the buffer circuit 103 as the third signal (second operation).

Whereas in the period during which the transistor 112 is off, the node at which the capacitor 114 connected to one of the source and the drain of the transistor 112 and the gate of the transistor 111 are connected to each other is in an electrically floating state. At this time, the capacitor 114 is provided with an H level. Accordingly, the potential of the node in an electrically floating state is further raised by the capacitive coupling. A signal which is boosted by this capacitive coupling is output to the buffer circuit 103 as the third signal (second operation).

By repeating the first operation and the second operation described above, the level-shift circuit 102 can output the third signal, the boosted second signal.

Note that the capacitors 113 and 114 are preferably elements whose dielectric breakdown does not occur owing to a high voltage. It is preferable that electrostatic capacitances of the capacitors 113 and 114 are 10 times or more as large as the gate capacitance of the buffer circuit 103. Note that in the case where the electrostatic capacitances of the capacitors 113 and 114 are increased, it is preferable that the second signal be converted into a signal with improved electric charge supply capability by the buffer circuit 101.

Note that the capacitors 113 and 114 may be provided over a substrate different from a substrate over which the transistors of the semiconductor device are formed so that the electrostatic capacitances thereof are increased.

The electrostatic capacitance of the capacitor 113 may be as large as that of the capacitor 114 or may be different therefrom.

The structure of the level-shift circuit 102 in FIG. 1 includes a structure in which the second signals are supplied to the capacitors 113 and 114 by the capacitive coupling. With such a structure, a high voltage is not applied directly between the source and the drain of each of the transistors 111 and 112 and thus dielectric breakdown of the transistor does not occur. Therefore, a driver circuit for driving the power transistor can be operated in a normal state and therefore its malfunction can be prevented. Furthermore, a shoot-through current can be prevented from flowing through the level-shift circuit 102, resulting in low power consumption.

The buffer circuit 103 is a circuit having a function of boosting the third signal output from the level-shift circuit 102 to a signal that can operate the fourth buffer circuit 104 and/or converting the third signal into a signal with improved electric charge supply capability to be output. The signal input into the buffer circuit 103 is supplied to a gate of a transistor included in the buffer circuit 103. Signals output from the buffer circuit 103 are signals input into the buffer circuit 104.

In FIG. 1, the signal supplied to the gate of the transistor included in the buffer circuit 103 is referred to as a third signal. Moreover, in FIG. 1, the signal output from the buffer circuit 103 and input into the buffer circuit 104 is referred to as a fourth signal (expressed as 4th signal in the drawing). Note that the fourth signals are originally the signals supplied to the terminals IN_H and IN_L, and two signals are supplied to the two wirings in FIG. 1.

Note that although, in FIG. 1, the buffer circuit 103 is provided between the level-shift circuit 102 and the buffer circuit 104, another buffer circuit may be added therebetween. Alternatively, a delay circuit such as a flip-flop may be added.

The buffer circuit 104 includes the transistor 121 and the transistor 122. The transistor 121 is connected to a wiring supplied with a voltage V1 for driving the power transistor. The transistor 122 is connected to a wiring supplied with a voltage V2 for driving the power transistor. A signal output from the buffer circuit 104 is supplied to the power transistor (not illustrated) provided outside through a terminal OUT.

Note that the voltage V1 is a voltage for turning on the power transistor connected to the terminal OUT. The voltage V2 is a voltage for turning off the power transistor connected to the terminal OUT. A voltage output from the terminal OUT to control switching of the power transistor connected to the terminal OUT is switched between the voltage V1 and the voltage V2 by the buffer circuit 104 and is output. Note that in some cases the voltage V1 is referred to as a first voltage and the voltage V2 is referred to as a second voltage. Each of the voltage V1 and the voltage V2 is preferably a voltage generated by being boosted using a bootstrap circuit on the basis of a high power source potential VDD. In the case where each of the voltage V1 and the voltage V2 is higher than the high power source potential VDD, each thereof may be a voltage generated by stepping down the high power source potential VDD. The voltage V1 and the voltage V2 each may be a voltage directly applied from the outside. Note that the voltage V1 is higher than the voltage V2.

The buffer circuit 104 is a circuit having a function of outputting the voltage V1 or the voltage V2 for driving the power transistor on the basis of the fourth signal output from the buffer circuit 103. The signal input into the buffer circuit 104 is supplied to a gate of the transistor 121 or 122 of the buffer circuit 104. The signal output from the buffer circuit 104 is a signal for driving the power transistor provided outside, which is output through the terminal OUT. Note that as described above, the fourth signals supplied to the gates of the transistors 121 and 122 are originally the signals supplied to the terminals IN_H and IN_L. The fourth signal alternately turns on the transistors 121 and 122. Therefore, the signal output from the terminal OUT is a signal output by switching between the voltage V1 and the voltage V2.

The semiconductor device 100 described above includes a structure in which the signals are supplied to the capacitors 113 and 114 in the level-shift circuit 102 by the capacitive coupling. With such a structure, a high voltage is not applied directly between the source and the drain of each of the transistors 111 and 112 and thus dielectric breakdown of the transistor does not occur. Therefore, a driver circuit for driving the power transistor can be operated in a normal state and therefore its malfunction can be prevented. Furthermore, a shoot-through current can be prevented from flowing through the level-shift circuit 102, resulting in low power consumption.

Next, a more specific circuit configuration of the semiconductor device 100 shown in FIG. 1 and an operation thereof are described with reference to FIG. 2, FIGS. 3A and 3B, FIG. 4, FIGS. 5A and 5B, and FIG. 6.

Figure 2:
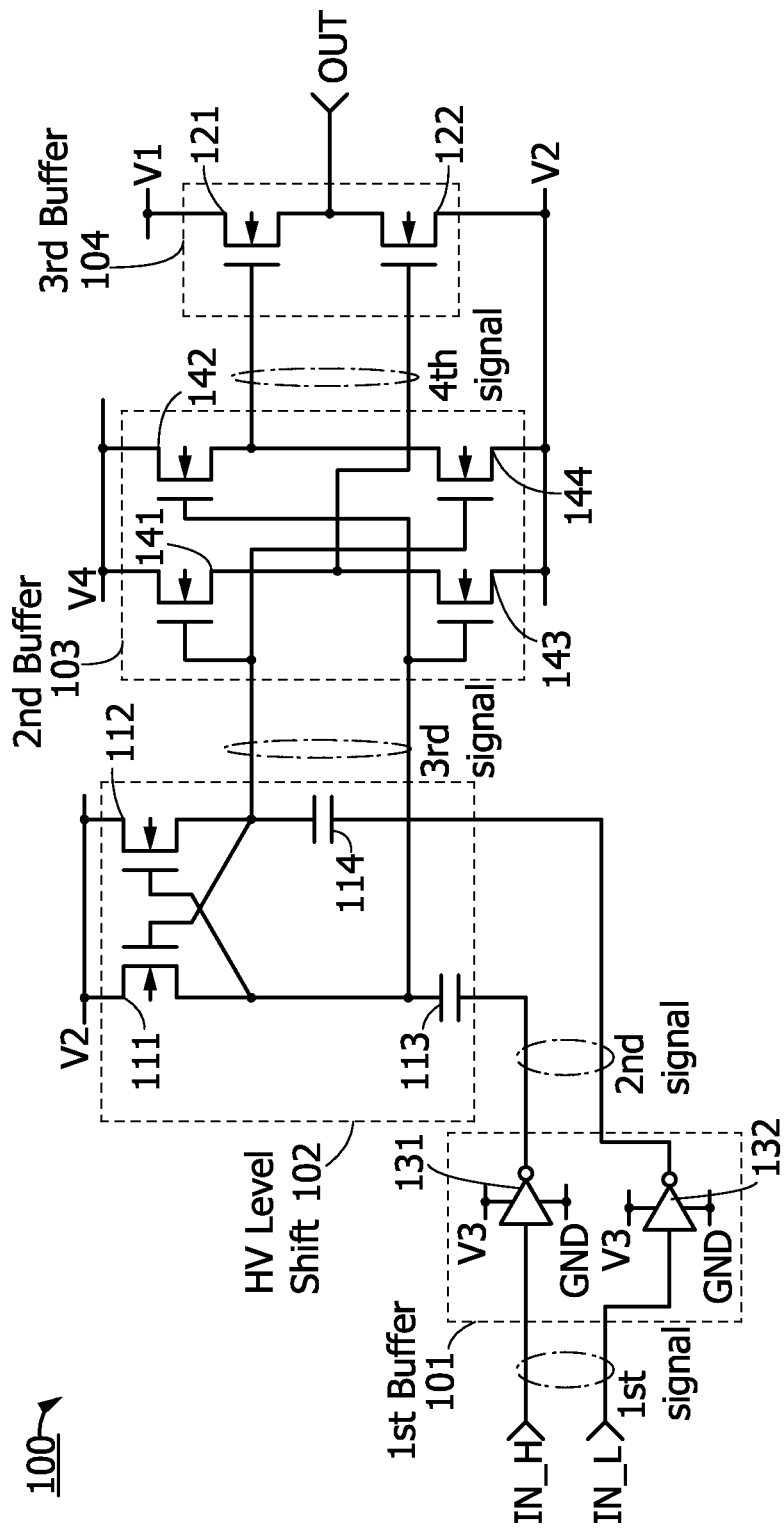
FIG. 2 is a circuit diagram showing the structure of a semiconductor device.

FIG. 2 illustrates a specific example of the circuit configuration of the block diagram of the semiconductor device shown in FIG. 1.

The buffer circuit 101 shown in FIG. 2 includes an inverter circuit 131 and an inverter circuit 132 which serve as buffers of the PWM signals supplied to the terminal IN_H and the terminal IN_L. The inverter circuit 131 and the inverter circuit 132 are supplied with power source voltages by a wiring supplied with a voltage V3 and a wiring supplied with a ground potential GND, respectively. Moreover, the inverter circuits 131 and 132 include transistors having the same conductivity type as the transistors 111 and 112 included in the level-shift circuit 102.

Figure 3A:
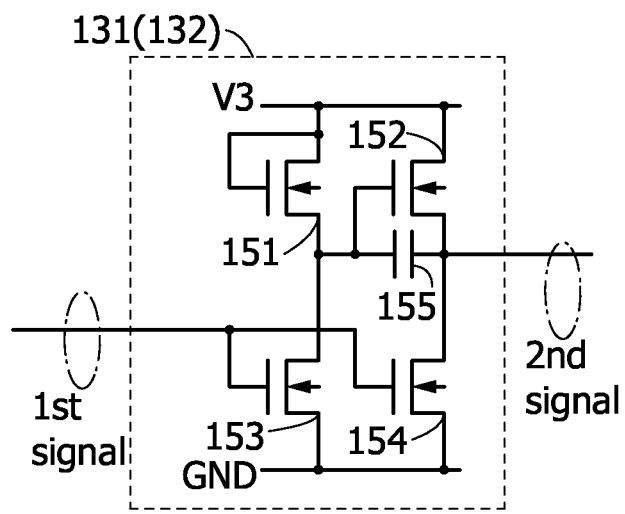
FIGS. 3A and 3B are circuit diagrams showing the structure of a semiconductor device.

Here FIG. 3A illustrates an example of the circuit configuration of the inverter circuits 131 and 132 each including an n-channel transistor as the transistor having the same conductivity type.

The inverter circuit 131 (or the inverter circuit 132) shown in FIG. 3A includes a transistor 151, a transistor 152, a transistor 153, a transistor 154, and a capacitor 155. As well as the transistors 111 and 112 shown in each of FIG. 1 and FIG. 2, the transistors 151, 152, 153, and 154 are n-channel transistors.

Note that a voltage V3 is a voltage for boosting the level-shift circuit 102 by charging and discharging the capacitors 113 and 114 with electric charges. The wiring supplied with the voltage V3 preferably has high electric charge supply capability so that the capacitors 113 and 114 can be charged and discharged with electric charges at high speed. Note that in some cases the voltage V3 is referred to as a third voltage. The voltage V3 is preferably a voltage generated by being boosted using a bootstrap circuit on the basis of a high power source potential VDD. In the case where the voltage V3 is higher than the high power source potential VDD, the voltage V3 may be a voltage generated by stepping down the high power source potential VDD. The voltage V3 may be a voltage directly applied from the outside. Note that the voltage V3 is lower than the voltage V1 and the voltage V2.

One of source and drain terminals of each of the transistors 151 and 152 is connected to the wiring supplied with the voltage V3. One of source and drain terminals of each of the transistors 153 and 154 is connected to the wiring supplied with the ground potential GND. The capacitor 155 is provided between a gate of the transistor 152 and the other of the source and drain terminals thereof. The inverter circuit 131 (or the inverter circuit 132) shown in FIG. 3A is a circuit that can output an inverted signal of the first signal as a second signal.

Figure 3B:
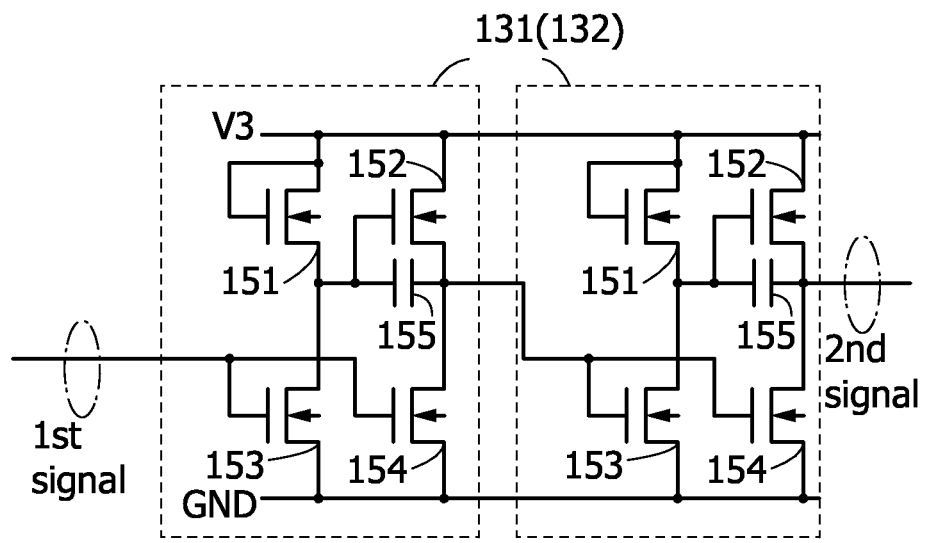
Figure 4:
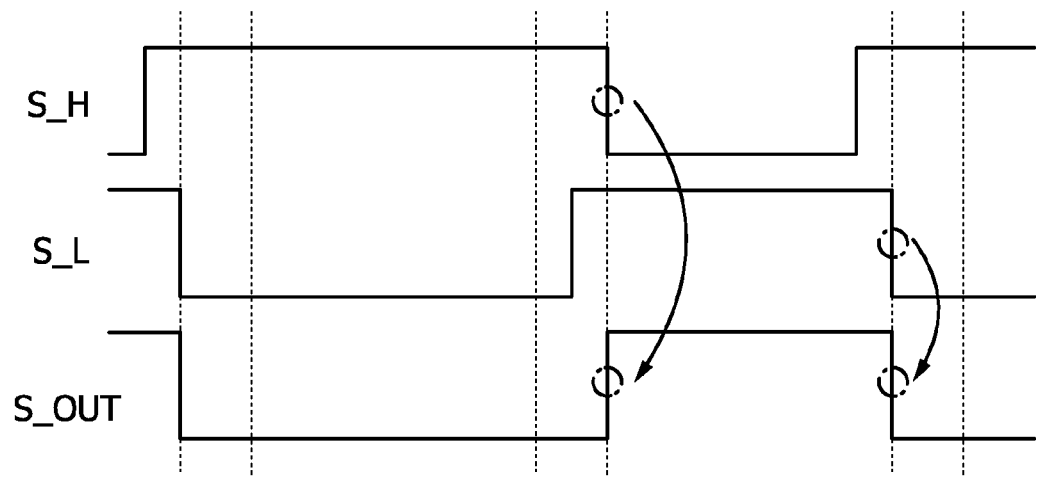
FIG. 4 is a timing chart for describing the operation of a semiconductor device.

Note that the inverter circuits 131 (or the inverter circuits 132) shown in FIG. 3A may be electrically arranged in series as shown in FIG. 3B so that a second signal in which a logic value of the first signal is inverted again to the original logic value can be output.

The structure of the level-shift circuit 102 shown in FIG. 2 is similar to that of the level-shift circuit 102 described with reference to FIG. 1. FIG. 2 as well as FIG. 1 illustrates the transistors 111 and 112 of the level-shift circuit 102 as n-channel transistors.

The buffer circuit 103 shown in FIG. 2 includes a transistor 141, a transistor 142, a transistor 143, and a transistor 144. The buffer circuit 103 is connected to a wiring supplied with a voltage V4 and the wiring supplied with the voltage V2. The buffer circuit 103 outputs signals supplied to the gates of the transistors 121 and 122 of the buffer circuit 104 as fourth signals which are switched between the voltage V4 and the voltage V2 on the basis of the third signals. Note that as well as the transistors 111 and 112 shown in each of FIG. 1 and FIG. 2, the transistors 141, 142, 143, and 144 are n-channel transistors.

Note that the voltage V4 is a voltage for further boosting the third signal so that the transistors 121 and 122 can be certainly turned on. This boosting is performed to prevent the transistors 121 and 122 from not being certainly turned on in the case, for example, where the voltages of the third signals output through the transistors 111 and 112 are reduced by threshold voltages of the transistors. Note that in some cases the voltage V4 is referred to as a fourth voltage. The voltage V4 is preferably a voltage generated by being boosted using a bootstrap circuit on the basis of a high power source potential VDD. In the case where the voltage V4 is higher than the high power source potential VDD, the voltage V4 may be a voltage generated by stepping down the high power source potential VDD. The voltage V4 may be a voltage directly applied from the outside. Note that the voltage V4 is as high as the voltage V1 or higher than the voltage V1.

When the PWM signal supplied to the terminal IN_H is regarded as a PWM signal S_H and the PWM signal supplied to the terminal IN_L is regarded as a PWM signal S_L, an output signal supplied to the terminal OUT is regarded as an output signal S_OUT. The PWM signals S_H and S_L and the output signal S_OUT can be expressed as shown in a timing chart in FIG. 4. Note that although the PWM signals S_H and S_L and the output signal S_OUT are shown with the same height, the amplitude voltage of the output signal S_OUT is actually smaller than those of the PWM signals S_H and S_L. Note that amplitude potentials of the PWM signals S_H and S_L correspond to voltages which are boosted by the above-described buffer circuit 101, level-shift circuit 102, and buffer circuit 103 and which control the on state and off state of the transistors 121 and 122 of the buffer circuit 104. Then, in the semiconductor device 100, the output signal S_OUT for outputting either the voltage V1 or the voltage V2 can be output in accordance with the boosted PWM signals S_H and S_L.

In the structure of the semiconductor device 100 shown in FIG. 2, the voltage of a wiring for supplying a low power source potential in the buffer circuit 101 may be different from the voltage of a wiring for supplying low power source potentials in the buffer circuits 103 and 104. Specifically, the voltage of the wiring for supplying the low power source potential in the buffer circuit 101 can be a ground potential GND, and the voltage of the wiring for supplying the low power source potentials in the buffer circuits 103 and 104 can be a voltage V2. Therefore, malfunction can be reduced that occurs in the case where current resulting from a reactance component which is accumulated in the wirings flows through the terminals IN_H and IN_L supplied with the PWM signals when such a current flows through the semiconductor device 100.

The transistors 111 and 112, the transistors 121 and 122, the transistors 141 to 144, and the transistors 151 to 154 described with reference to FIG. 2 and FIGS. 3A and 3B are n-channel transistors. That is, the buffer circuits 101, 103, and 104 and the level-shift circuit 102 of the semiconductor device can be formed using transistors having the same conductivity type.

In the case where the semiconductor device is configured by transistors having the same conductivity type, the number of photomasks to separately form an n-channel transistor and a p-channel transistor can be reduced as compared to the case where the driver circuit is configured by complementary transistors. Therefore, the manufacturing cost can be reduced with the structure of the present invention.

In the case of configuring a driver circuit for converting a PWM signal into a high-voltage signal only by replacing the transistors for configuring the semiconductor device with transistors having the same conductivity type, the dielectric breakdown of the transistors might occur because of a high voltage used to convert the signal. On the other hand, the semiconductor device having the structure of this embodiment includes a structure in which the signals are supplied to the capacitors 113 and 114 in the level-shift circuit 102 by the capacitive coupling. With such a structure, a high voltage is not applied directly between the source and the drain of each of the transistors 111 and 112 and thus dielectric breakdown of the transistor does not occur. Therefore, a driver circuit for driving the power transistor can be operated in a normal state and therefore its malfunction can be prevented.

Moreover, in the semiconductor device having the structure of this embodiment, the semiconductor device is configured by the transistors having the same conductivity type, whereby a semiconductor material other than silicon can be used for semiconductor layers of the transistors. As an example, the transistors can be formed using an oxide semiconductor for semiconductor layers thereof.

An oxide semiconductor has an energy gap greater than or equal to 3.0 eV and less than or equal to 3.5 eV. This energy gap is larger than that of silicon. Accordingly, an oxide semiconductor can reduce the number of carriers generated by thermal excitation to an extremely small amount. Therefore, characteristics of a transistor including an oxide semiconductor in a semiconductor layer do not deteriorate even in a high-temperature environment; thus, a change in electrical characteristics can be kept small.

Specifically, the oxide semiconductor is preferably a highly purified oxide semiconductor (purified OS) obtained by reduction of impurities such as moisture or hydrogen serving as electron donors (donors) and reduction of oxygen vacancies. A purified oxide semiconductor is an intrinsic (i-type) semiconductor or a substantially i-type semiconductor. For this reason, a transistor having a channel formation region in a highly purified oxide semiconductor layer has an extremely low off-state current and is highly reliable in a high-temperature environment. The transistor including an oxide semiconductor, which has such characteristics, is preferably used as the transistor used in the semiconductor device of this embodiment.

The circuits of the above-described semiconductor device 100 are configured by transistors having the same conductivity type. With such a structure, transistors including an oxide semiconductor can be used as the transistors for configuring the semiconductor device 100. Moreover, with such a structure, the transistors for configuring the semiconductor device 100 can be transistors whose off-state current is extremely low and reliability in a high-temperature environment is improved. Therefore, it is possible to prevent malfunctions of the transistors for configuring the semiconductor device 100 due to a temperature change. Furthermore, limitation on arrangement of the semiconductor device 100, for example, in advance, the power transistor and the semiconductor device are provided separately from each other or a cooling unit is provided so that the semiconductor device 100 can be prevented from having a high temperature can be eliminated.

Figure 5A:
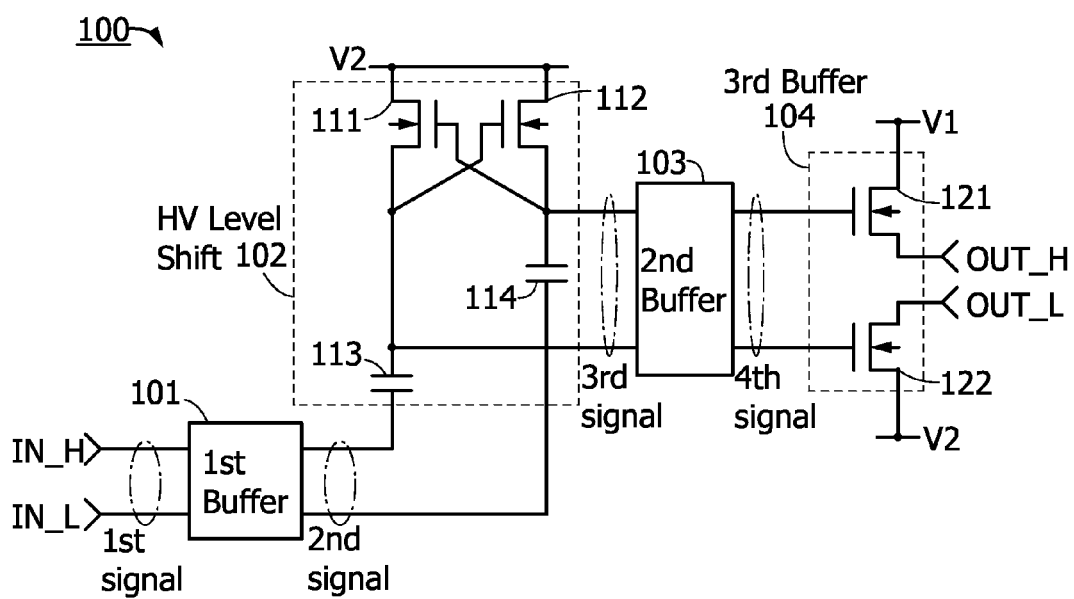
FIGS. 5A and 5B are a circuit diagram and a block diagram showing a structure of a semiconductor device.

Note that the output terminal OUT of the semiconductor device 100, the structure of which is shown in FIG. 2, can be divided into two output terminals, an output terminal OUT_H and an output terminal OUT_L as shown in FIG. 5A. When the output terminal is divided into the output terminal OUT_H and the output terminal OUT_L as shown in FIG. 5A, a shoot-through current flowing between power supply lines can be reduced.

Figure 5B:
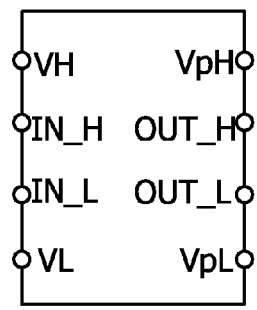

A simplified block diagram of the semiconductor device 100 in FIG. 5A is shown in FIG. 5B. Note that terminals shown in FIG. 5B correspond to terminals of the circuits shown in FIG. 5A, and a terminal VH and a terminal VL correspond to a terminal supplied with the voltage V3 and a terminal supplied with a ground potential GND, respectively.

Furthermore, a terminal VpH and a terminal VpL shown in FIG. 5B are a terminal for supplying the voltage V1 and a terminal for supplying the voltage V2, respectively. Note that the voltage V4 may be boosted using a bootstrap circuit on the basis of the voltage V1.

Figure 6:
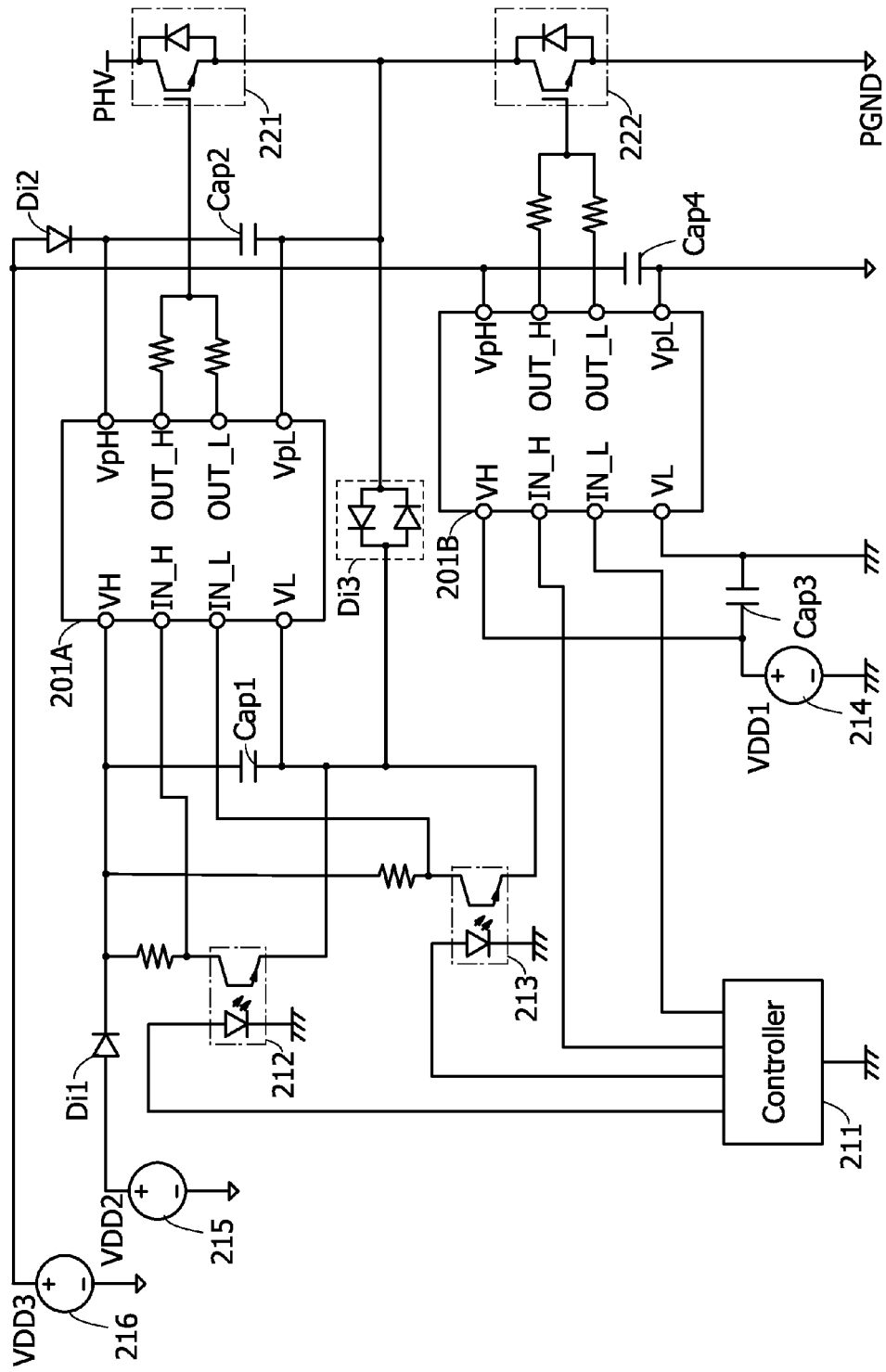
FIG. 6 is a circuit diagram showing the structure of a semiconductor device.

Next, FIG. 6 illustrates an application example of a semiconductor device for driving the power transistor with reference to the block diagram in FIG. 5B.

FIG. 6 shows the structure of the low-side driver including the semiconductor device 100 in FIG. 5A, which includes a semiconductor device 201A and a semiconductor device 201B. As another structure, FIG. 6 illustrates a control circuit 211 (expressed as Controller in the drawing), photocouplers 212 and 213, reference voltage generation circuits 214, 215, and 216, diodes Di1, Di2, and Di3, capacitors Cap1, Cap2, Cap3, and Cap4, and power transistors 221 and 222. Note that in the circuit diagram shown in FIG. 6, resistors provided on wirings are elements provided to convert flowing current into voltage. In the circuit diagram in FIG. 6, a voltage PHV and a voltage PGND are voltages to be applied to loads (not shown) connected to the power transistors 221 and 222.

PWM signals output from the control circuit 211 are supplied to the semiconductor devices 201A and 201B through the photocouplers 212 and 213, or wirings. As the voltages V1, V2, and V3, reference voltages VDD1, VDD2, and VDD3 are respectively supplied from the reference voltage generation circuits 214, 215, and 216 to the semiconductor devices 201A and 201B. Note that as the reference voltages VDD1, VDD2, and VDD3, the reference voltages VDD1, VDD2, and VDD3 respectively output from the reference voltage generation circuits 214, 215, and 216, which are boosted using the diodes Di1 and Di2 and the capacitors Cap1 and Cap2, are supplied to the semiconductor devices 201A and 201B.

Note that in the structure of the low-side driver shown in FIG. 6, the diode Di3 is provided between the terminals VL and VpL of the semiconductor device 201A so that current flows in both directions. The diode Di3 is an element provided as needed to cause a short circuit so that a large potential difference does not occur between the terminals such that malfunction does not occur in the case where a difference between voltages applied to the terminals VL and VpL is largely changed.

In the semiconductor device described above in this embodiment, the buffer circuits and the level-shift circuit are configured by transistors having the same conductivity type. Therefore, the transistors provided in the semiconductor device can be transistors having the same conductivity type.

Furthermore, in the semiconductor device, the capacitors are provided in the level-shift circuit, and the signals to be boosted are supplied to the capacitors and are boosted using capacitive coupling of the capacitors. With such a structure, voltage applied between the source and the drain of each of the transistors in the level-shift circuit can be made lower than voltage applied to each of the capacitors in the level-shift circuit, whereby dielectric breakdown of the transistors can be suppressed.

This embodiment can be implemented in appropriate combination with any of the other embodiments.

Embodiment 2

In this embodiment, an oxide semiconductor that can be used for the semiconductor layer of the transistor having the same conductivity type described in the above embodiment will be described.

An oxide semiconductor used for a channel formation region in the semiconductor layer of the transistor preferably contains at least indium (In) or zinc (Zn). In particular, the oxide semiconductor preferably contains both In and Zn. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn—based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide in which an atomic ratio of In to Ga and Zn is 1:1:1, 3:1:2, or 2:1:3, or an oxide whose composition is in the neighborhood of the above compositions may be used.

When the oxide semiconductor film forming the semiconductor layer contains a large amount of hydrogen, hydrogen and the oxide semiconductor are bonded to each other, so that part of hydrogen serves as a donor to cause generation of an electron which is a carrier. As a result, the threshold voltage of the transistor shifts in the negative direction. Therefore, it is preferable that, after the formation of the oxide semiconductor film, heat treatment for dehydration be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Note that the off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

Next, a structure of an oxide semiconductor is described.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

This embodiment can be implemented in appropriate combination with any of the other embodiments.

Embodiment 3

In this embodiment, a cross-sectional structure of a transistor included in a semiconductor device of one embodiment of the disclosed invention will be described with reference to drawings.

FIGS. 7A and 7B, FIGS. 8A and 8B, and FIGS. 9A and 9B each illustrate an example of part of a cross-sectional structure of the transistor included in a semiconductor device of one embodiment of the present invention. Note that in this embodiment, as the transistor, a transistor whose semiconductor layer is formed using an oxide semiconductor is formed over a substrate.

Note that a change in electrical characteristics of a transistor including an oxide semiconductor due to the temperature can be reduced compared to that of a transistor including silicon. Therefore, even when the semiconductor device is provided in close contact with IGBT which has a high temperature owing to switching operation, a change in electrical characteristics can be suppressed and thus malfunction of the semiconductor device can be reduced.

Figure 7A:
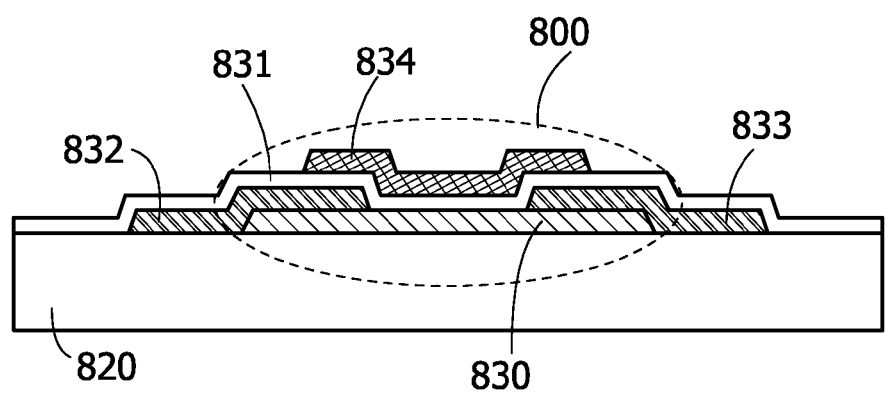
FIGS. 7A and 7B are each a cross-sectional view of a transistor.

In FIG. 7A, an n-channel transistor 800 is formed over a substrate 820. FIG. 7A illustrates a coplanar transistor as an example.

The transistor 800 includes, over the substrate 820, a semiconductor film 830 containing an oxide semiconductor, conductive films 832 and 833 functioning as a source electrode and a drain electrode over the semiconductor film 830, a gate insulating film 831 over the semiconductor film 830 and the conductive films 832 and 833, and a conductive film 834 functioning as a gate electrode that is positioned over the gate insulating film 831 and overlaps with the semiconductor film 830 between the conductive films 832 and 833.

The substrate 820 may be a glass substrate, a ceramic substrate, a quartz substrate, a sapphire substrate, or the like. For example, a single crystal semiconductor substrate or a polycrystalline semiconductor substrate of silicon, silicon carbide, or the like; a compound semiconductor substrate of silicon germanium or the like; an SOI substrate; or the like can be used.

The conductive films 832, 833, and 834 can be formed using a metal material such as molybdenum, titanium, tantalum, tungsten, aluminum, copper, chromium, neodymium, or scandium, or an alloy material containing any of these materials as a main component. The conductive films 832, 833, and 834 may each have a single-layer structure or a stacked-layer structure.

The gate insulating film 831 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 831 may be a stack of any of the above materials.

Figure 7B:
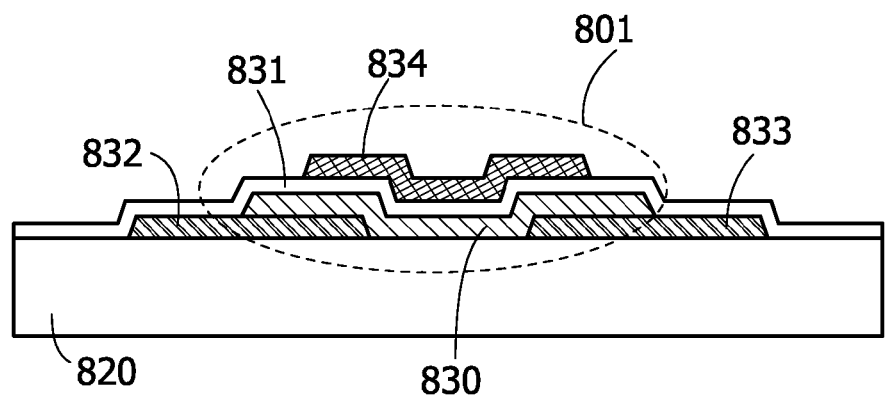

Note that although FIG. 7A illustrates a coplanar transistor, a structure of a staggered transistor like a transistor 801 illustrated in FIG. 7B may also be employed.

The transistor 801 includes, over the substrate 820, the conductive films 832 and 833 functioning as a source electrode and a drain electrode, the semiconductor film 830 containing an oxide semiconductor over the conductive films 832 and 833, the gate insulating film 831 over the semiconductor film 830 and the conductive films 832 and 833, and the conductive film 834 functioning as a gate electrode that is positioned over the gate insulating film 831 and overlaps with the semiconductor film 830 between the conductive films 832 and 833.

Figure 8A:
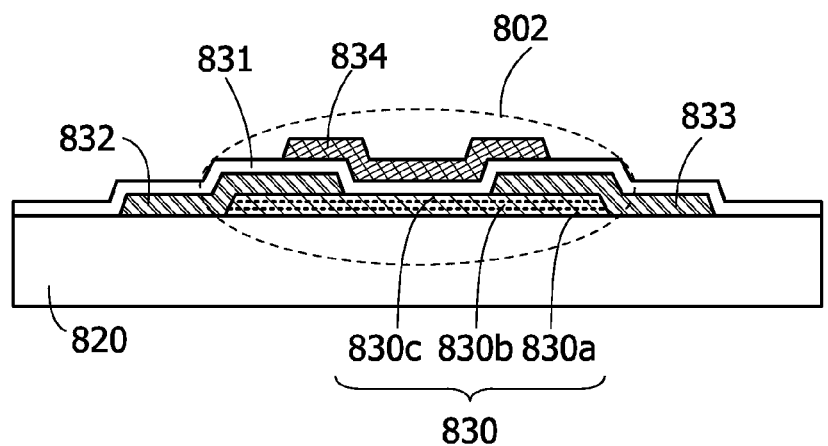
FIGS. 8A and 8B are each a cross-sectional view of a transistor.
Figure 8B:
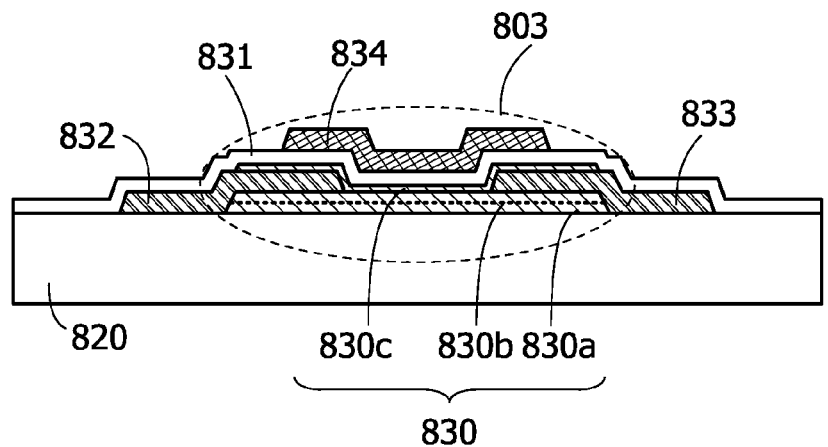

The semiconductor film 830 is not limited to a single oxide semiconductor film and may be a stack including a plurality of oxide semiconductor films. FIGS. 8A and 8B illustrate examples of the structure of the transistor 800 in which the semiconductor film 830 has a three-layer structure.

A transistor 802 illustrated in FIG. 8A includes the semiconductor film 830 over the substrate 820 and the like, the conductive films 832 and 833 electrically connected to the semiconductor film 830, the gate insulating film 831, and the conductive film 834 functioning as a gate electrode provided over the gate insulating film 831 so as to overlap with the semiconductor film 830.

As the semiconductor film 830 in the transistor 802, oxide semiconductor layers 830*a*, 830*b*, and 830*c* are stacked in this order from the substrate 820 side.

The oxide semiconductor layers 830*a* and 830*c* are each an oxide film that contains at least one of metal elements contained in the oxide semiconductor layer 830*b*. The energy at the bottom of the conduction band of the oxide semiconductor layers 830*a* and 830*c* is closer to a vacuum level than that of the oxide semiconductor layer 830*b* by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830*b* preferably contains at least indium to increase carrier mobility.

Note that as in a transistor 803 illustrated in FIG. 8B, the oxide semiconductor layer 830*c* overlapping with the gate insulating film 831 may be partly provided over the conductive films 832 and 833.

Figure 9A:
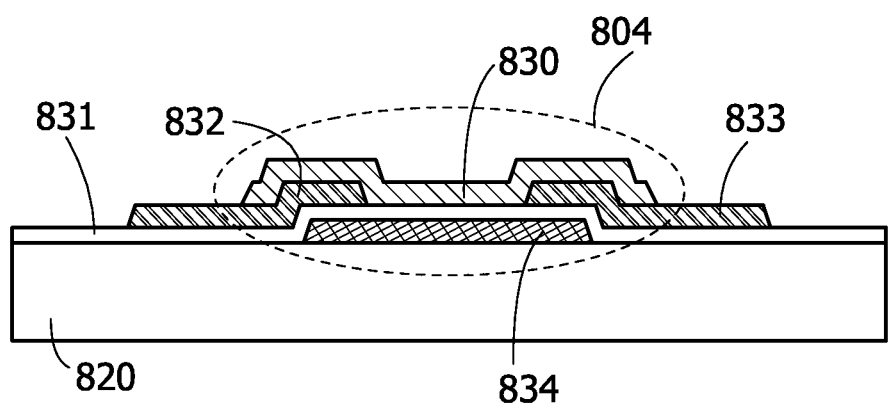
FIGS. 9A and 9B are each a cross-sectional view of a transistor.

Furthermore, as the structure of a transistor provided over the substrate 820, a bottom gate transistor as well as the top gate transistors illustrated in FIGS. 7A and 7B may be employed. FIG. 9A illustrates an inverted coplanar transistor as an example.

A transistor 804 includes, over the substrate 820, the conductive film 834 functioning as a gate electrode, the gate insulating film 831 over the conductive film 834, the conductive films 832 and 833 that are positioned over the gate insulating film 831 and function as a source electrode and a drain electrode, and the semiconductor film 830 over the conductive films 832 and 833.

Figure 9B:
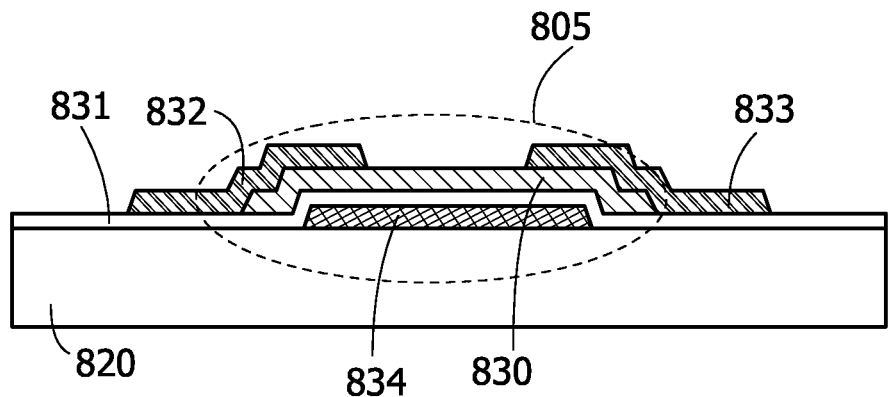

Note that although FIG. 9A illustrates an inverted coplanar transistor, a structure of an inverted staggered transistor like a transistor 805 illustrated in FIG. 9B may also be employed.

The transistor 805 includes, over the substrate 820, the conductive film 834 functioning as a gate electrode, the gate insulating film 831 over the conductive film 834, the semiconductor film 830 over the gate insulating film 831, and the conductive films 832 and 833 that are positioned over the semiconductor film 830 and function as a source electrode and a drain electrode.

Note that in FIGS. 7A and 7B, FIGS. 8A and 8B, and FIGS. 9A and 9B, the transistors 800 to 805 each include the conductive film 834 functioning as a gate electrode on at least one side of the semiconductor film 830; alternatively, the transistors 800 to 805 may include a pair of gate electrodes with the semiconductor film 830 positioned therebetween.

When the transistors 800 to 805 each include a pair of gate electrodes with the semiconductor film 830 positioned therebetween, one of the gate electrodes may be supplied with a signal for controlling the on/off state, and the other of the gate electrodes may be supplied with a potential from another element. In the latter case, potentials with the same level may be supplied to the pair of gate electrodes, or a fixed potential such as a ground potential may be supplied only to the other of the gate electrodes. By controlling the level of a potential supplied to the other of the gate electrodes, the threshold voltages of the transistors 800 to 805 can be controlled.

This embodiment can be implemented in appropriate combination with any of the other embodiments.

Embodiment 4

In this embodiment, application examples of the semiconductor device described in the foregoing embodiment to an electronic component and to an electronic device including the electronic component will be described with reference to FIGS. 10A and 10B and FIGS. 11A and 11B.

Figure 10A:
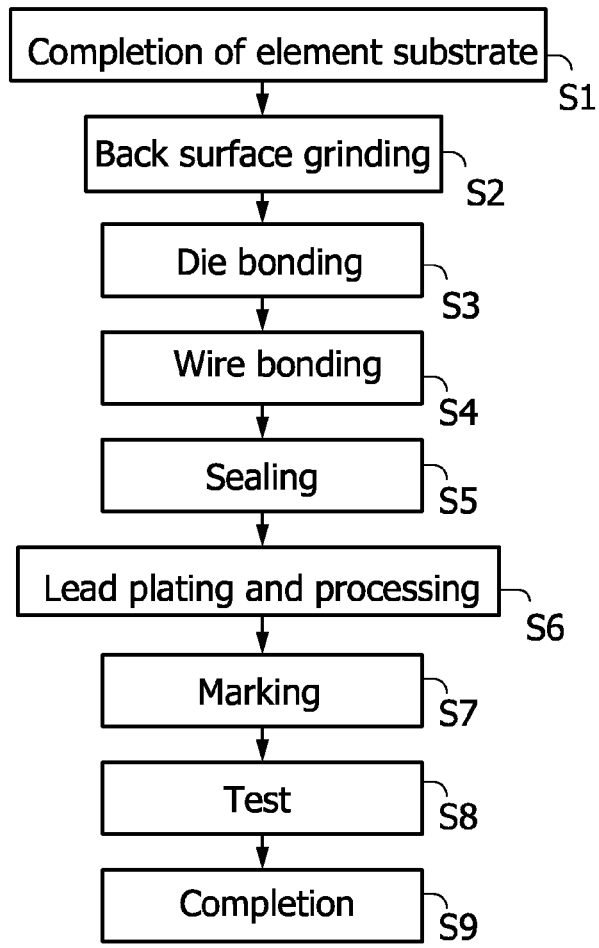
FIGS. 10A and 10B are a flow chart illustrating steps of manufacturing a semiconductor device and a schematic perspective view of the semiconductor device.

FIG. 10A illustrates an example where the semiconductor device described in the foregoing embodiment is used to make an electronic component. Note that an electronic component is also referred to as a semiconductor package or an IC package. For the electronic component, there are a variety of standards and names corresponding to the direction of terminals or the shape of terminals; hence, one example of the electronic component will be described in this embodiment.

A semiconductor device including the transistors illustrated in FIGS. 7A and 7B, FIGS. 8A and 8B, and FIGS. 9A and 9B of Embodiment 3 undergoes the assembly process (post-process) and is completed by using a combination of components detachable to a printed circuit board.

The post-process can be completed through steps shown in FIG. 10A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that a circuit unit and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The electronic component described above includes the semiconductor device of the foregoing embodiment; thus, the electronic component including the semiconductor device in which the frequency of malfunction in a high-temperature environment is reduced and manufacturing cost is reduced can be obtained. Since the electronic component includes the semiconductor device in which the frequency of malfunction in a high-temperature environment is reduced and manufacturing cost is reduced, limit of the electronic component on a usage environment is relieved and the size thereof is reduced.

Figure 10B:
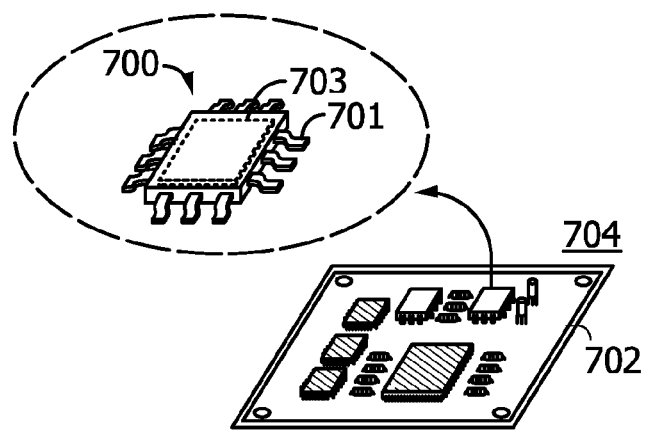

FIG. 10B is a perspective schematic diagram of a completed electronic component. FIG. 10B is a perspective schematic diagram of a quad flat package (QFP) as an example of the electronic component. An electronic component 700 illustrated in FIG. 10B includes a lead 701 and a semiconductor device 703. The electronic component 700 in FIG. 10B is, for example, mounted on a printed circuit board 702. A plurality of electronic components 700 are used in combination to be electrically connected to each other over the printed wiring board 702; thus, a board on which the electronic components are mounted (a mounted board 704) is completed. The completed mounted board 704 is provided in an electronic device or the like.

Figure 11A:
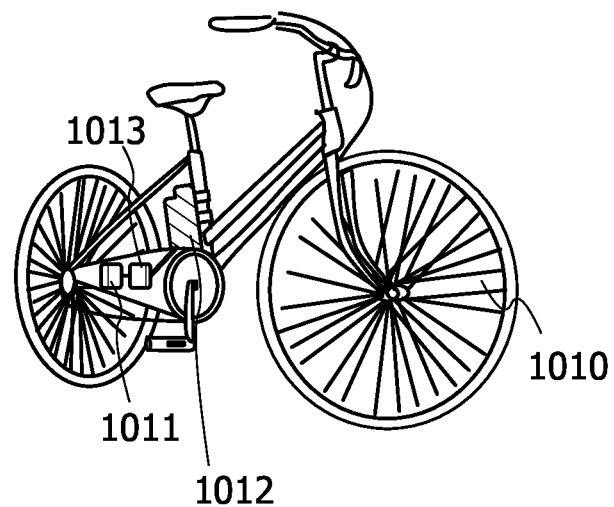
FIGS. 11A and 11B each illustrate an electronic device using a semiconductor device.
Figure 11B:
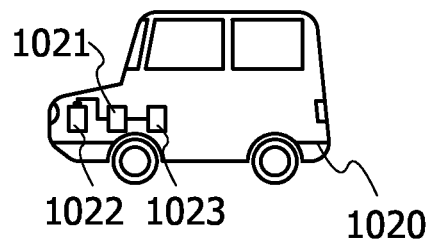

Next, with reference to FIGS. 11A and 11B, application examples of the electronic components which are applied to a driver circuit for driving an inverter, a motor, or the like, which is provided in a vehicle that is driven with power from a fixed power supply (e.g., a bicycle), are described.

FIG. 11A illustrates an electric bicycle 1010 as an application example. The electric bicycle 1010 obtains power when current is fed through a motor unit 1011. The electric bicycle 1010 includes a battery 1012 for supplying current fed through the motor unit 1011 and a driver circuit 1013 for driving the motor unit 1011. Note that pedals in FIG. 11A may be omitted.

A mounted board provided with an electronic component including the semiconductor device described in the foregoing embodiment is incorporated in the driver circuit 1013. Therefore, an electric bicycle provided with an electronic component whose limit on a usage environment is relieved and whose size is reduced is obtained.

FIG. 11B illustrates an electric car 1020 as another application example. The electric car 1020 obtains power when current is fed through a motor unit 1021. The electric car 1020 includes a battery 1022 for supplying current fed through the motor unit 1021 and a driver circuit 1023 for driving the motor unit 1021.

A mounted board provided with an electronic component including the semiconductor device described in the foregoing embodiment is incorporated in the driver circuit 1023. Therefore, an electric car provided with an electronic component whose limit on a usage environment is relieved and whose size is reduced is obtained.

As described above, the electronic device shown in this embodiment incorporates a mounted board provided with an electronic component including the semiconductor device described in any of the foregoing embodiments, thereby relieving limit of the electronic device on a usage environment and reducing the size thereof.

This application is based on Japanese Patent Application Ser. No. 2013-099804 filed with the Japan Patent Office on May 10, 2013, the entire contents of which are hereby incorporated by reference.

What is claimed is:

1. A semiconductor device comprising:
   a first buffer circuit that converts a first signal into a second signal;
   a level-shift circuit that converts the second signal into a third signal;
   a second buffer circuit that converts the third signal into a fourth signal; and
   a third buffer circuit that outputs a first potential or a second potential in accordance with the fourth signal,
   the third buffer circuit comprising:
      a first transistor;
      a second transistor; and
      an output terminal,
   wherein the fourth signal is supplied to a gate of the first transistor, and an inverted signal of the fourth signal is supplied to a gate of the second transistor,
   wherein a first terminal of the first transistor is electrically connected to a wiring for supplying the first potential, and a first terminal of the second transistor is electrically connected to a wiring for supplying the second potential,
   wherein a second terminal of the first transistor and a second terminal of the second transistor are electrically connected to the output terminal,
   wherein the level-shift circuit, the first buffer circuit, the second buffer circuit, and the third buffer circuit comprise transistors having the same conductivity type, and
   wherein the second signal is supplied to a capacitor in the level-shift circuit and converted into the third signal by capacitive coupling.

2. The semiconductor device according to claim 1, wherein a semiconductor layer of each of the transistors comprises an oxide semiconductor.

3. The semiconductor device according to claim 1, wherein a low power source potential supplied to the first buffer circuit is lower than a low power source potential supplied to the second buffer circuit and a low power source potential supplied to the third buffer circuit.

4. The semiconductor device according to claim 1, wherein a high power source potential supplied to the first buffer circuit is different from a high power source potential supplied to the second buffer circuit and a high power source potential supplied to the third buffer circuit.

5. A semiconductor device comprising:
   a first buffer circuit that converts a first signal into a second signal;
   a level-shift circuit that converts the second signal into a third signal;
   the level-shift circuit comprising:
      a first transistor;
      a second transistor;
      a first capacitor; and
      a second capacitor,
   a second buffer circuit that converts the third signal into a fourth signal;
   the second buffer circuit comprising:
      a third transistor;
      a fourth transistor;
      a fifth transistor;
      a sixth transistor,
      a first output terminal,
      a second output terminal, and
   a third buffer circuit that outputs a first potential or a second potential in accordance with the fourth signal,
   the third buffer circuit comprising:
      a seventh transistor;
      an eighth transistor; and
      a third output terminal,
   wherein a first terminal of the first transistor and a first terminal of the second transistor are electrically connected to a wiring for supplying the second potential, wherein one of the electrodes of the first capacitor is electrically connected to a second terminal of the first transistor, a gate of the second transistor, and the second buffer circuit, wherein one of the electrodes of the second capacitor is electrically connected to a second terminal of the second transistor, a gate of the first transistor, and the second buffer circuit, wherein the second signal is supplied to the other electrode of the first capacitor, and an inverted signal of the second signal is supplied to the other electrode of the second capacitor, wherein the level-shift circuit, the first buffer circuit, the second buffer circuit, and the third buffer circuit comprise transistors having the same conductivity type, wherein the third signal is supplied to a gate of the third transistor and a gate of the sixth transistor and, an inverted signal of the third signal is supplied to a gate of the fourth transistor and a gate of the fifth transistor, wherein a first terminal of the third transistor and a first terminal of the fourth transistor are electrically connected to a wiring for supplying the first potential, and a first terminal of the fifth transistor and a first terminal of the sixth transistor are electrically connected to a wiring for supplying the second potential, wherein a second terminal of the third transistor and a second terminal of the fifth transistor are electrically connected to the first output terminal, wherein a second terminal of the fourth transistor and a second terminal of the sixth transistor are electrically connected to the second output terminal, wherein the first output terminal outputs the fourth signal and the second output terminal outputs an inverted signal of the fourth signal, wherein the fourth signal is supplied to a gate of the seventh transistor, and an inverted signal of the fourth signal is supplied to a gate of the eighth transistor, wherein a first terminal of the seventh transistor is electrically connected to a wiring for supplying the first potential, and a first terminal of the eighth transistor is electrically connected to a wiring for supplying the second potential, and wherein a second terminal of the seventh transistor and a second terminal of the eighth transistor are electrically connected to the third output terminal.

6. The semiconductor device according to claim 5,
wherein a semiconductor layer of each of the transistors comprises an oxide semiconductor.

7. The semiconductor device according to claim 5,
wherein a low power source potential supplied to the first buffer circuit is lower than a low power source potential supplied to the second buffer circuit and a low power source potential supplied to the third buffer circuit.

8. The semiconductor device according to claim 5,
wherein a high power source potential supplied to the first buffer circuit is different from a high power source potential supplied to the second buffer circuit and a high power source potential supplied to the third buffer circuit.

9. A semiconductor device comprising:
a first buffer circuit that converts a first signal into a second signal;
a level-shift circuit that converts the second signal into a third signal;
the level-shift circuit comprising:
a first transistor;
a second transistor;
a first capacitor; and
a second capacitor,
a second buffer circuit that converts the third signal into a fourth signal; and
a third buffer circuit that outputs a first potential or a second potential in accordance with the fourth signal,
the third buffer circuit comprising:
a third transistor;
a fourth transistor; and
an output terminal, wherein a first terminal of the first transistor and a first terminal of the second transistor are electrically connected to a wiring for supplying the second potential, wherein one of the electrodes of the first capacitor is electrically connected to a second terminal of the first transistor, a gate of the second transistor, and the second buffer circuit, wherein one of the electrodes of the second capacitor is electrically connected to a second terminal of the second transistor, a gate of the first transistor, and the second buffer circuit, wherein the second signal is supplied to the other electrode of the first capacitor, and an inverted signal of the second signal is supplied to the other electrode of the second capacitor, wherein the fourth signal is supplied to a gate of the third transistor, and an inverted signal of the fourth signal is supplied to a gate of the fourth transistor, wherein a first terminal of the third transistor is electrically connected to a wiring for supplying the first potential, and a first terminal of the fourth transistor is electrically connected to a wiring for supplying the second potential, wherein a second terminal of the third transistor and a second terminal of the fourth transistor are electrically connected to the output terminal, and wherein the level-shift circuit, the first buffer circuit, the second buffer circuit, and the third buffer circuit comprise transistors having the same conductivity type.

10. The semiconductor device according to claim 9,
wherein a semiconductor layer of each of the transistors comprises an oxide semiconductor.

11. The semiconductor device according to claim 9,
wherein a low power source potential supplied to the first buffer circuit is lower than a low power source potential supplied to the second buffer circuit and a low power source potential supplied to the third buffer circuit.

12. The semiconductor device according to claim 9,
wherein a high power source potential supplied to the first buffer circuit is different from a high power source potential supplied to the second buffer circuit and a high power source potential supplied to the third buffer circuit.

* * * * *